United States Patent
Seiler

(10) Patent No.: US 10,950,305 B1
(45) Date of Patent: Mar. 16, 2021

(54) SELECTIVE PIXEL OUTPUT

(71) Applicant: Facebook Technologies, LLC, Menlo Park, CA (US)

(72) Inventor: Larry Seiler, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/586,341

(22) Filed: Sep. 27, 2019

Related U.S. Application Data

(60) Provisional application No. 62/755,154, filed on Nov. 2, 2018.

(51) Int. Cl.
| | |
|---|---|
| *G11C 14/00* | (2006.01) |
| *G06T 15/60* | (2006.01) |
| *G09G 5/39* | (2006.01) |
| *G06T 19/00* | (2011.01) |

(52) U.S. Cl.
CPC .......... *G11C 14/0018* (2013.01); *G06T 15/60* (2013.01); *G06T 19/006* (2013.01); *G09G 5/39* (2013.01)

(58) Field of Classification Search
CPC ... G11C 14/0018; G06T 15/60; G06T 19/006; G09G 5/39
USPC .................................................... 365/185.08
See application file for complete search history.

(56) References Cited

U.S. PATENT DOCUMENTS

| | | | | |
|---|---|---|---|---|
| 2014/0267377 A1* | 9/2014 | Halstvedt | ................ | G06T 11/40 345/613 |
| 2015/0317763 A1* | 11/2015 | Mather | ..................... | G06T 1/60 345/506 |

* cited by examiner

*Primary Examiner* — Harry W Byrne
(74) *Attorney, Agent, or Firm* — Baker Botts L.L.P.

(57) ABSTRACT

In one embodiment, a computing system may write a first set of pixel values in a tile order into a first buffer with the pixel values organized into a first set of tiles. The system may generate first validity data for the first set of tiles. The first validity data may include a validity indicator for each tile to indicate if that tile is a valid tile. The system may read from the first buffer a first subset of pixel values in a pixel row order corresponding to pixel rows of the first set of tiles based on the valid data. The first subset of pixel values may be associated with valid tiles of the first set of tiles. The system may send the first subset of pixel values and the first validity data of the first set of tiles to a display via an output data bus.

20 Claims, 12 Drawing Sheets

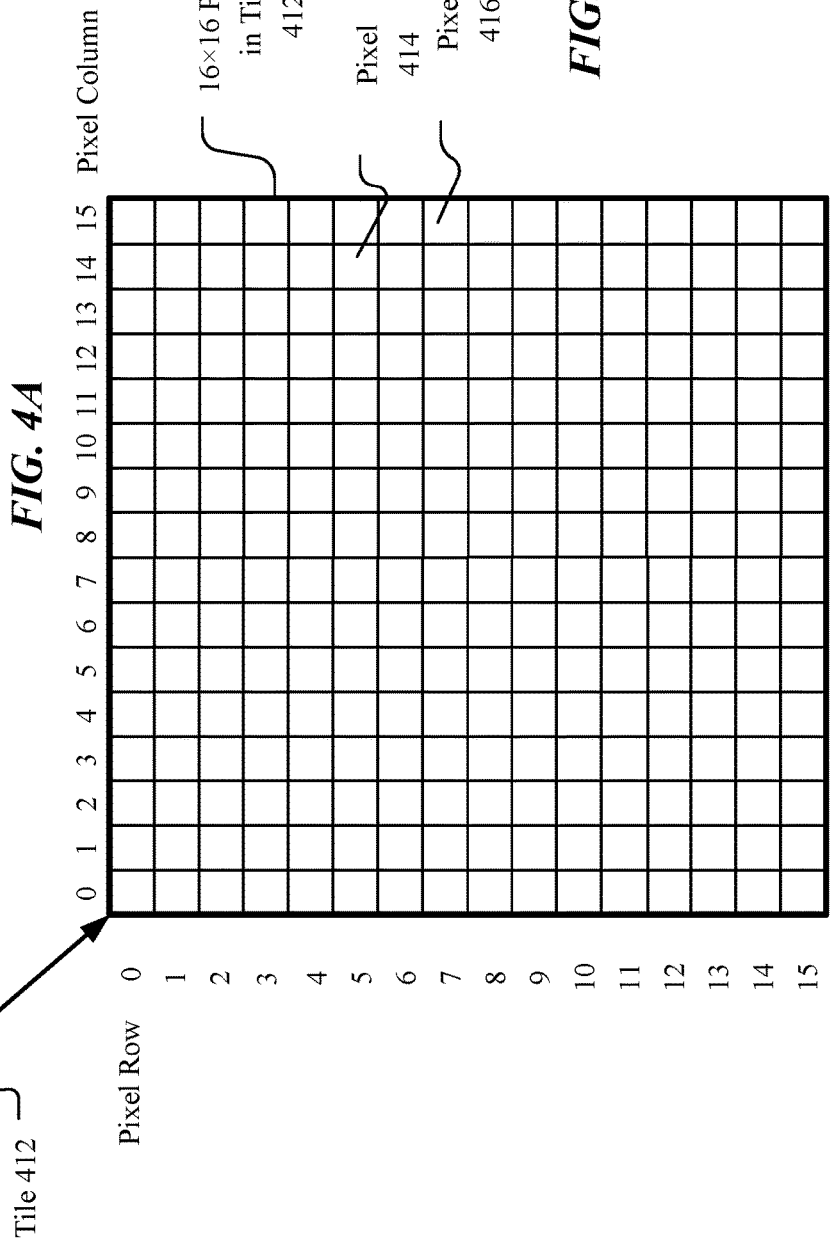

FIG. 5B

SELECTIVE PIXEL OUTPUT

PRIORITY

This application claims the benefit, under 35 U.S.C. § 119(e), of U.S. Provisional Patent Application No. 62/755,154, filed 2 Nov. 2018, which is incorporated herein by reference.

TECHNICAL FIELD

This disclosure generally relates to artificial reality, such as virtual reality and augmented reality.

BACKGROUND

Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

SUMMARY OF PARTICULAR EMBODIMENTS

Particular embodiments described herein relate to systems and methods for selectively transmitting pixel data for display based on the associated displaying content to allow uncompressed display data to be transmitted through the width-limited data bus at high update rates. For example, the system may organize pixels into a number tiles which are marked (e.g., by respective tile-validity bits) as either valid tiles or invalid tiles. The valid tiles may be tiles that are associated with any display content in the scene to be displayed. The invalid tiles may be tiles associated with areas where there is no display content to displayed (e.g., black background areas). The system may only output the pixels of valid tiles and skip the pixels of the invalid tiles to reduce the bandwidth requirement on the data bus for transmitting the display data. The system may output the tile-validity meta-data with the pixels of valid tiles to any downstream device, including display devices for image display (e.g., AR/VR headsets, monitor, etc.) or processing units for further image processing (e.g., field-programmable gate array). The downstream device may assemble the intended display content based on the received pixels and the corresponding tile-validity meta-data (e.g., tile-validity bit values). For example, screen areas corresponding to the invalid tiles may be left unlit or unaugmented (e.g., in an augmented-reality system, no augmented content may be displayed in invalid tile regions, but the corresponding pixels may still display the live underlying real-world scene captured by an inside-out camera). Particular embodiments of the system reduce bandwidth requirement for transmitting display data at high update rates and reduce the power consumption for driving the display by keeping the areas corresponding to the black tiles unlit.

The embodiments disclosed herein are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

BRIEF DESCRIPTION OF THE DRAWINGS

FIG. 4A illustrates an example pixel buffer storing two rows of tiles.

FIG. 4B illustrates an example tile including 16×16 pixels.

FIG. 5B illustrates an example pattern for storing pixels in two data banks of the pixel buffer to support the tile-order writing and pixel-row-order reading operations.

DESCRIPTION OF EXAMPLE EMBODIMENTS

Particular embodiments of the artificial reality system need to provide display data at high update rates (e.g., 200

Hz~800 Hz). However, the data bus for transmitting display data may have a limited width (e.g., 2×36-bit), which makes it infeasible to transmit all display data (e.g., 1600×2560 resolution) at such high update rates with the given limited data bus bandwidth. Traditional methods rely on data compression to reduce the data bandwidth requirement. However, data compression may lead to information loss, and therefore result in suboptimal display results or may limit what a subsequent downstream processing unit could do.

To solve this problem, particular embodiments of the system may selectively transmit pixel data based on the associated displaying content to allow uncompressed display data to be transmitted through the width-limited data bus at high update rates. For example, the system may organize pixels into a number of tiles which are marked (e.g., by tile-validity meta-data) as either valid tiles or invalid tiles. The valid tiles may be associated with the objects in the scene to be displayed and the invalid tiles may be associated with the areas where there are no objects to displayed (e.g., black background areas). The system may only output the pixels of valid tiles and skip the pixels of the invalid tiles to reduce the bandwidth requirement on the transmitting data bus. The system may output the tile-validity meta-data with the pixels of the valid tiles to allow the downstream device to assemble the image content without losing any information through compression.

Particular embodiments of the system reduce bandwidth requirement for transmitting display data to downstream devices at high update rates by transmitting selected pixels based on associated displaying content. Particular embodiments of the system eliminate information loss caused by data compression, as uncompressed display data is sent rather than compressed data for display, and therefore enable better display quality. Particular embodiments of the system reduce the power consumption for driving the display by keeping the areas corresponding to the invalid tiles unlit. Particular embodiments of the system allow the displaying content of external displays to be updated at a higher pixel rate than the native pixel rate of the headset system.

Figure 1A:
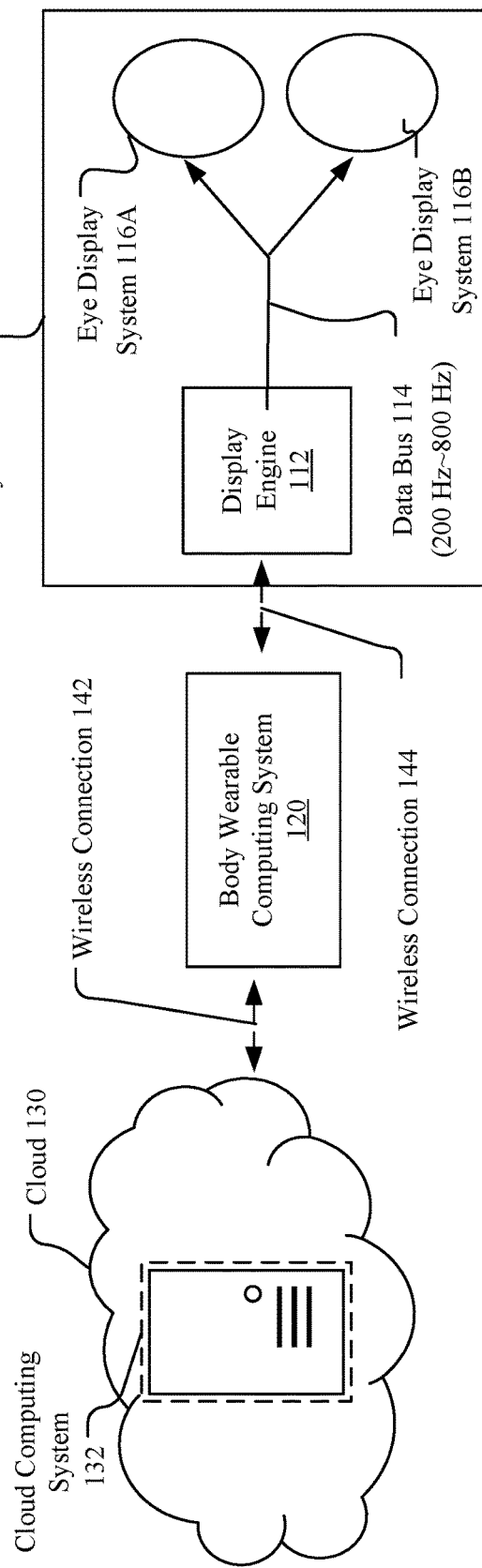
FIG. 1A illustrates an example artificial reality system.

FIG. 1A illustrates an example artificial reality system 100. In particular embodiments, the artificial reality system 100 may include a headset system 110, a body wearable computing system 120, a cloud computing system 132 in a cloud 130, etc. In particular embodiments, the headset system 110 may include a display engine 112 which is connected to two eye display systems 116A and 116B through a data bus 114. The headset system 110 may be a system including a head-mounted display (HMD) which may be mounted on a user's head to provide artificial reality to the user. The headset system 110 may have limited amount of power available in its power sources (e.g., batteries). The display engine 112 may provide display data to the eye display systems 116A and 116B though the data bus 114 with relative high data rates (e.g., 200 Hz~800 Hz). As will be discussed later, the display engine 112 may include one or more controller blocks, texel memories, transform blocks, pixel blocks, etc. The texels stored in the texel memories may be accessed by pixel blocks and may be provided to the eye display systems 116A and 116B for display.

Figure 1B:
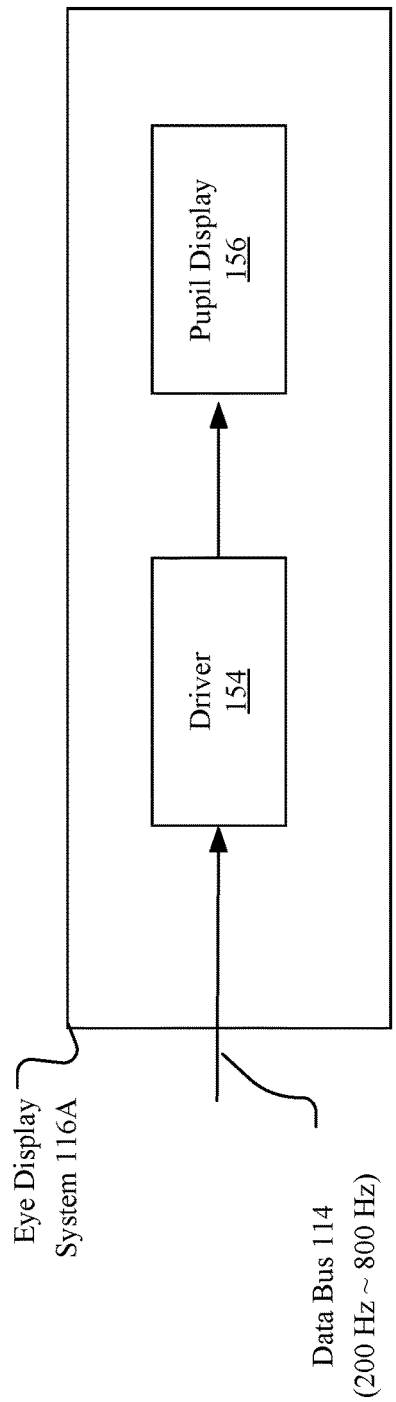
FIG. 1B illustrates an example eye display system of the headset system.

In particular embodiments, the body wearable computing system 120 may be worn on the body of a user. In particular embodiments, the body wearable computing system 120 may be a computing system (e.g., a laptop, a desktop, a mobile computing system) that is not worn on a user body. The body wearable computing system 120 may include one or more GPUs, one or more smart video decoders, memories, processors, and other modules. The body wearable computing system 120 may have more computational resources than the display engine 112 but may still have limited amount power in its power sources (e.g., batteries). The body wearable computing system 120 may be coupled with the headset system 110 through a wireless connection 144. The cloud computing system 132 may be high performance computers (e.g., servers) and may communicate with the body wearable computing system 120 through a wireless connection 142. FIG. 1B illustrates an example eye display system (e.g., 116A or 116B) of the headset system 110. In particular embodiments, the eye display system 116A may include a driver 154, a pupil display 156, etc. The display engine 112 may provide display data to the pupil display 156 the data bus 114 and the driver 154 at high data rates (e.g., 200 Hz~800 Hz).

Figure 2:
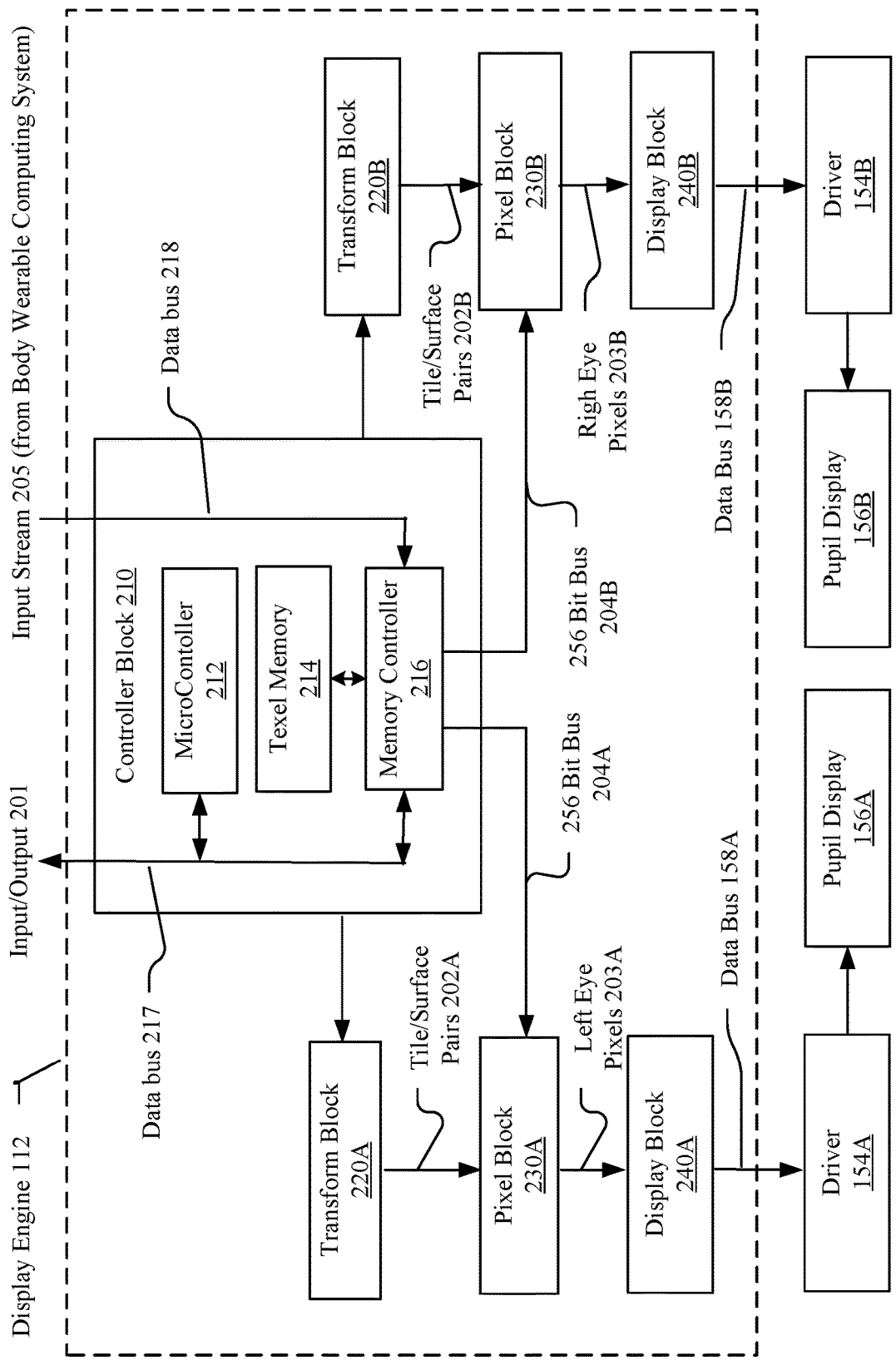
FIG. 2 illustrates a system diagram for a display engine.

FIG. 2 illustrates a system diagram for a display engine 112. In particular embodiments, the display engine 112 may include a control block 210, transform blocks 220A and 220B, pixel blocks 230A and 230B, display blocks 240A and 240B, etc. One or more of the components of the display engine 112 may be configured to communicate via a high-speed bus, shared memory, or any other suitable method. As shown in FIG. 2, the control block 210 of display engine 112 may be configured to communicate with the transform blocks 220A and 220B, pixel blocks 230A and 230B, and display blocks 240A and 240B. As explained in further detail herein, this communication may include data as well as control signals, interrupts and other instructions.

In particular embodiments, the control block 210 may receive input from the body wearable computing system (e.g., 114 in FIG. 1) and initialize a pipeline in the display engine to finalize the rendering for display. In particular embodiments, the control block 210 may receive data and control packets from the body wearable computing system. The data and control packets may include information such as one or more surfaces comprising texture data and position data and additional rendering instructions. The control block 210 may distribute data as needed to one or more other blocks of the display engine 112. The control block 210 may initiate pipeline processing for one or more frames to be displayed. In particular embodiments, the eye display systems 116A and 116B may each comprise its own control block 210. In particular embodiments, one or more of the eye display systems 116A and 116B may share a control block 210.

In particular embodiments, the transform blocks 220A and 220B may determine initial visibility information for surfaces to be displayed in the artificial reality scene. In general, the transform blocks 220A and 220B may cast rays from pixel locations on the screen and produce filter commands (e.g., filtering based on bilinear or other types of interpolation techniques) to send to the pixel blocks 230A and 230B. The transform blocks 220A and 220B may perform ray casting from the current viewpoint of the user (e.g., determined using the headset's inertial measurement units, eye trackers, and/or any suitable tracking/localization algorithms, such as simultaneous localization and mapping (SLAM)) into the artificial scene where surfaces are positioned and may produce results to send to the pixel blocks 230A and 230B.

In general, the transform blocks 220A and 220B may each comprise a four-stage pipeline, in accordance with particular embodiments. The stages of a transform block 220A or 220B may proceed as follows. A ray caster may issue ray bundles corresponding to arrays of one or more aligned pixels, referred to as tiles (e.g., each tile may include 16×16 aligned pixels). The ray bundles may be warped, before entering the artificial reality scene, according to one or more distortion meshes. The distortion meshes may be configured to correct geometric distortion effects stemming from, at least, the eye display systems 116A and 116B of the headset system 110. The transform blocks 220A and 220B may determine whether each ray bundle intersects with surfaces in the scene by comparing a bounding box of each tile to bounding boxes for the surfaces. If a ray bundle does not intersect with an object, it may be discarded. Tile-surface intersections are detected, and the corresponding tile-surface pair is passed to the pixel blocks 230A and 230B.

In general, the pixel blocks 230A and 230B may determine color values from the tile-surface pairs to produce pixel color values, in accordance with particular embodiments. The color values for each pixel may be sampled from the texture data of surfaces received and stored by the control block 210. The pixel blocks 230A and 230B may receive tile-surface pairs from the transform blocks 220A and 220B and may schedule bilinear filtering. For each tile-surface pair, the pixel blocks 230A and 230B may sample color information for the pixels within the tile using color values corresponding to where the projected tile intersects the surface. In particular embodiments, the pixel blocks 230A and 230B may process the red, green, and blue color components separately for each pixel. In particular embodiments, the pixel block 230A of the display engine 112 of the first eye display system 116A may proceed independently, and in parallel with, the pixel block 230B of the display engine 112 of the second eye display system 116B. The pixel block may then output its color determinations to the display block.

In general, the display blocks 240A and 240B may receive pixel color values from the pixel blocks 230A and 230B, coverts the format of the data to be more suitable for the scanline output of the display, apply one or more brightness corrections to the pixel color values, and prepare the pixel color values for output to the display. The display blocks 240A and 240B may convert tile-order pixel color values generated by the pixel blocks 230A and 230B into scanline or row-order data, which may be required by the physical displays. The brightness corrections may include any required brightness correction, gamma mapping, and dithering. The display blocks 240A and 240B may output the corrected pixel color values directly to the physical display (e.g., pupil display 156 in FIG. 1 via the driver 154) or may output the pixel values to a block external to the display engine 112 in a variety of formats. For example, the eye display systems 116A and 116B or headset system 110 may comprise additional hardware or software to further customize backend color processing, to support a wider interface to the display, or to optimize display speed or fidelity.

In particular embodiments, the controller block 210 may include a microcontroller 212, a texel memory 214, a memory controller 216, a data bus 217 for I/O communication, a data bus 218 for input stream data 205, etc. The memory controller 216 and the microcontroller 212 may be coupled through the data bus 217 for I/O communication with other modules of the system. The microcontroller 212 may receive control packages such as position data and surface information though the data bus 217. The input stream data 205 may be input to controller blocks 210 from the body wearable computing system after being set up by the microcontroller 212. The input stream data 205 may be converted to the required texel format and stored into the texel memory 214 by the memory controller 216. In particular embodiments, the texel memory 214 may be static random-access memory (SRAM).

In particular embodiments, the pixel blocks 230A and 230B may determine the pixel values based on retrieved texels from the texel memory 214. The memory controller 216 may be coupled to pixel blocks 230A and 230B through two 256-bit data buses 204A and 204B, respectively. The pixel bocks 230A and 230B may receive the tile/surface pairs 202A and 202B from the respective transform blocks 220A and 220B and may identify the texels that are needed to determine all the pixels associated with the tile. The pixel blocks 230A and 230B may retrieve the identified texels (e.g., a 4×4 texel array) parallelly from the texel memory 214 through the memory controller 216 and the 256 bits data buses 204A and 204B. The pixel blocks 230A and 230B may determine pixel values based on the retrieved texels (e.g., using bilinear interpolation) and send the pixel data (e.g., 203A and 203B) to the display blocks 240A and 240B.

In particular embodiments, the display blocks 240A and 240B may need to provide display data to the pupil displays 156A and 156B (e.g., via the pupil display drivers 154A and 154B) with high pixel resolutions and high data update rates (e.g., 2560×1600 at 120 Hz, or/and 2560×1440 at 220 Hz). However, the data buses 158A and 158B, which connect the display blocks 240A and 240B to the drivers (154A, 154B) and pupil displays (156A, 156B) may have limited width (e.g., 2×36-bit). The width-limited data buses 158A and 158B may be incapable to transmit all the display data in uncompressed data formats to support the high resolutions and high update rates as required by the pupil displays. Traditional methods rely on data compression to reduce the data bandwidth requirement and to accommodate display data on the width-limited data bus. However, data compression may lead to information loss, and therefore result in suboptimal display quality.

Figure 3:
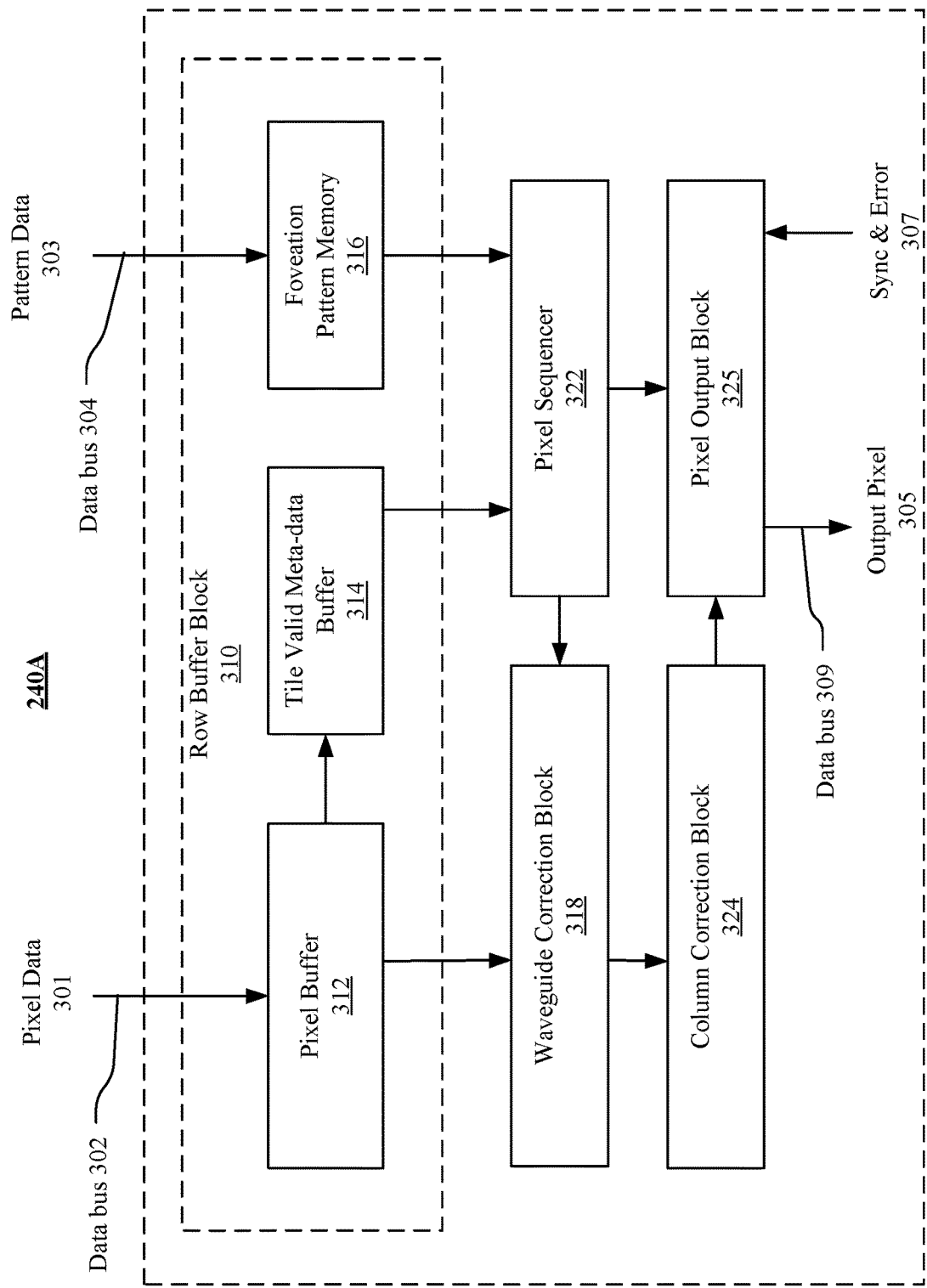
FIG. 3 illustrates an example display block of the headset system.

FIG. 3 illustrates an example display block (e.g., 240A or 240B) of the headset system. In particular embodiments, the display block 240A may include a row buffer block 310, a waveguide correction block 318, a pixel sequencer 322, a column correction block 324, a pixel output block 325, etc. The row buffer block 310 may include a pixel buffer 312, a tile valid meta-data buffer 314, a foveation pattern memory 316, etc. In particular embodiments, the pixel buffer 312 may include a first and a second tile-row ("tile-row" refers to a row of tiles) buffers each of which may store a row of tiles to support pixel reading and writing operations, as will be described later in this disclosure. In particular embodiments, the display block 240A may receive pixel data 301 (e.g., pixel color values) from the pixel block (e.g., 230A in FIG. 2) via the data bus 302. The display block 240A may process and store the received pixel data in the pixel buffer 312. The pixel data 301 received from the pixel block 230A may be organized in quads (e.g., 2×2 pixels per quad) and tiles (e.g., 16×16 pixels per tile). In particular embodiments, each pixel may have 36 bits including three 12-bit color components corresponding to the red, green, and blue colors. In particular embodiments, each pixel may include a linear light value in each 12-bit color component which has the full 12-bit precision as computed by the pixel block. In particular embodiments, each pixel may include a reduced number of bits by using a perceptual encoding. For 36-bit pixels, the four pixels in a 2×2 quad may correspond to 144-bit data which could be transmitted from the pixel block during one writing clock cycle through the data bus 302, which could be a 144-bit data bus. The pixel block may send a total 144-bit data corresponding to the four pixels, each of which includes three 12-bit color components, during one writing clock cycle. In particular embodiments, the three different color components may not require to be written in a way synchronized to each other. In particular embodiments, when there is a high throughput of 2×2 quads of pixels from the pixel block, the pixels may be organized in aligned 2×2 block pairs. The display block 240A may consolidate the aligned 2×2 block pairs into 4×4 pixel blocks and then write these 4×4 blocks into the pixel buffer 312 in the order of tiles. By doing this, the reading and writing operations may use a same basic pixel unit (e.g., any integral multiple of 4 pixels) and may use the same memory access port.

In particular embodiments, the display block 240A may generate a tile-validity bit for each tile stored in the pixel buffer 312. A 1-value in the tile-validity bit may indicate that the associated tile is a valid tile, which could be due to the tile containing displayable content. A 0-value in the tile-validity bit may indicate that the associated tile is an invalid tile corresponding to the black background areas on the scene. The tile valid bits may be generated when the tiles are written to the pixel buffer 312 and may be cleared when the pixels in the pixel buffer 312 are read out for display. The tile-validity bits may be stored in the tile-validity meta-data buffer 314 and may be referred as tile-validity meta-data. For example, the tile-validity meta-data associated with each tile in a buffer may be default to invalid (e.g., 0) when the buffer is cleared. As the display block 240A receive pixel data from the corresponding pixel block 230A, the tile-validity bit associated with each tile that receives pixel data would be set to valid (e.g., 1). The tile-validity bits associated with tiles that do not receive pixel data would remain invalid. In applications where a significant portion of the screen contains no rendered content, a significant portion of the tiles would be invalid. For example, in augmented reality applications, only a small portion of the entire display may contain augmented content (e.g., texts, labels, avatars, etc.), with the rest of the screen being occupied by the real-world scene. Since a significant portion of the tiles may be invalid, a significant portion of the corresponding pixel data would not need to be sent to the downstream device.

In particular embodiments, the display block 240A may receive foveation pattern data 303 from the corresponding pixel block via the 8-bit data bus 304 and the foveation pattern data 303 may be stored in the foveation pattern memory 316. Each foveation pattern may include 8 bits and may be associated with a tile stored in the pixel buffer 312. The waveguide correction block 318 and the column correction block 324 together with the pixel sequencer 322 and pixel output block 325 may modify the pixel values for brightness correction, gamma correction, dithering correction, etc. The linear light values of the pixels as computed by the pixel block may be converted into the values needed by physical displays (e.g., pupil displays). The pixel output block 325 may output pixel data to the physical displays while receiving video sync and error signals 307 from the displays.

In particular embodiments, the display block 240A may output a video stream to a mobile industry processor interface (MIPI) which may be implemented in an external logic unit to the display engine or the headset system. The output path may support display stream compression (DSC). The output pixel data of the display block 240A may include 8-bit corresponding to 24-bit pixels or 10-bit color components corresponding to 30-bit pixels. The output pixel data may be transmitted to a display through the external logic unit's MIPI interfaces, which may perform display stream compression (DSC) to reduce the bandwidth. In particular embodiments, the pixel output block 325 may support outputs for single MIPI, dual MIPI, or/and full pixel mode. In particular embodiments, the pixel output block 325 may support LCD panels, pupil displays, or/and an interposer FPGA that performs additional processing on the pixels. Pixels may be sent out sequentially from left to right and from top to bottom for the LCD display.

In particular embodiments, the display block 240A may have a raw output path for external devices or units (e.g., FPGA). When this video output path is enabled, the display block 240A may output either two 36-bit pixels or a tile-validity meta-data that specifies the length of a sequence of pixels associated with both valid and invalid tiles (the invalid tile may be displayed as black). The 36-bit pixels may each include three 12-bit color components and may be sent to an external FPGA (e.g., through the external logic unit's MIPI interfaces). In particular embodiments, this external FPGA chip may be used to customize the backend color correction or to support a wider display interface without DSC compression. In particular embodiments, this external FPGA may support for other forms of color corrections, gamma corrections, error diffusion corrections, dithering corrections, etc. The external FPGA may support a higher pixel rate that the headset system's native pixel rate by using the tile-validity meta-data to exclude pixels associated with a sequence of black pixels. The pixel rates supported by the external FPGA may be limited only by the percentage of valid pixels in each row of the display. For example, if half the pixels are invalid, the pixel rate provided by the FPGA may be doubled.

Figure 4C:
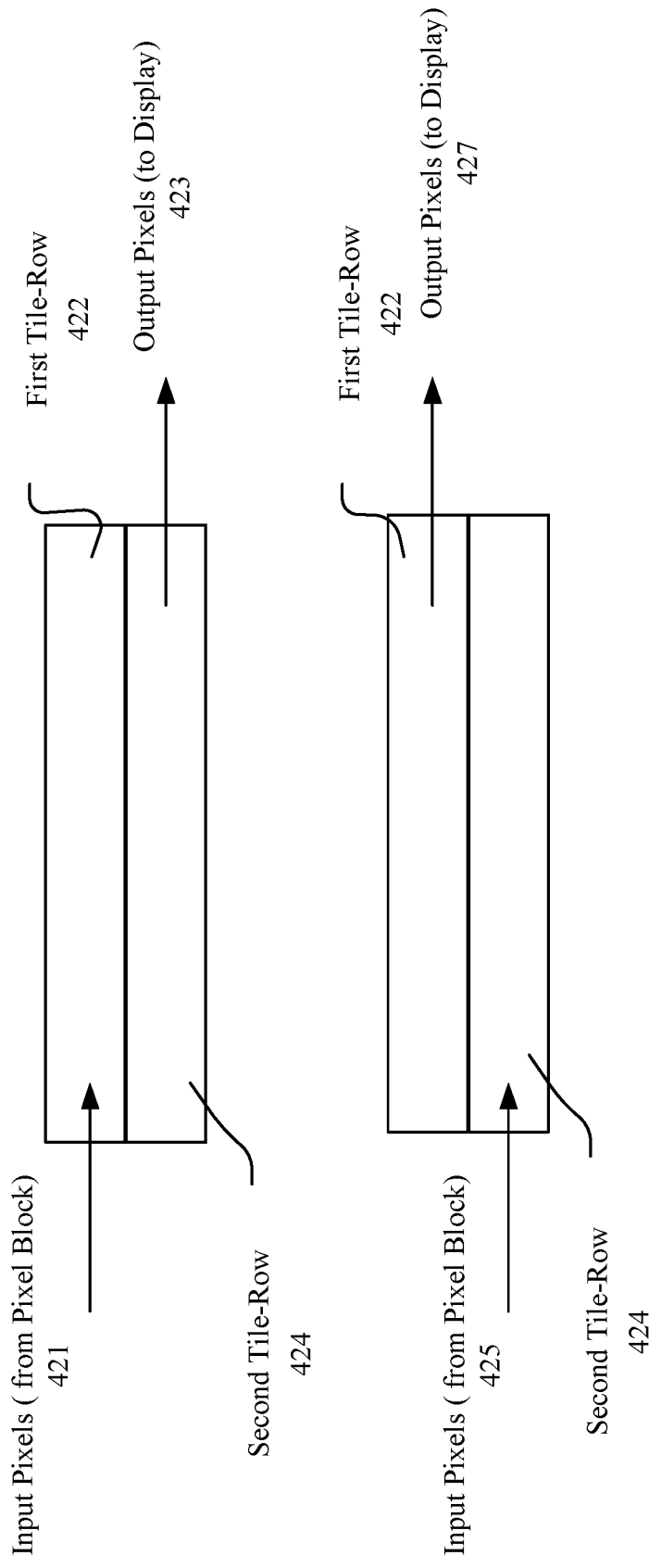
FIG. 4C illustrates example processes for writing and reading the double buffered pixel buffer.

FIG. 4A illustrates an example pixel buffer storing two rows of tiles. FIG. 4B illustrates an example tile 412 which includes 16×16 pixels (e.g., pixel 414, pixel 416). In particular embodiments, the pixel buffer may be double-buffered to store two rows of tiles with each tile row including 160 tiles. The 160×2 tiles array may correspond to a 2560× 32 pixel area of a display (e.g., with a pixel resolution of 2560×1600 or 2560×1440). The double-buffered pixel buffer may allow the pixel block to write to one side of the double buffers (e.g., the first tile-row) while pixels in the other side (e.g., the second tile-row) are being output to the display. FIG. 4C illustrates example processes for writing and reading the double buffered pixel buffer. In a first state, the input pixels 421 from the corresponding pixel block may be written to the first tile-row 422 while the output pixels 423 are read out from the second tile-row 424. When the data writing and reading processes have finished on the respective first and second tile-rows 422 and 424, the display block may swap the two tile-rows of the pixel buffer, and repeat these writing and reading processes. In a second state (after the two tile-rows being swapped), the input pixels 525 may be written into the second tile-row 424 while the output pixels 427 being read out from the first tile-row 422. When the data writing and reading processes have finished on the respective second and first tile-rows 424 and 422, the display block may swap the two tile-rows again, and repeat the pixel writing and reading processes. Each time the two tile-rows are swapped, the pixels of a new row of tiles may be written into one the two tile-rows while the pixels of the former tile row are being reading out from the other tile-row. The display block may repeat these processes to receive pixel data from the corresponding pixel block and output display data to physical displays.

Figure 5A:
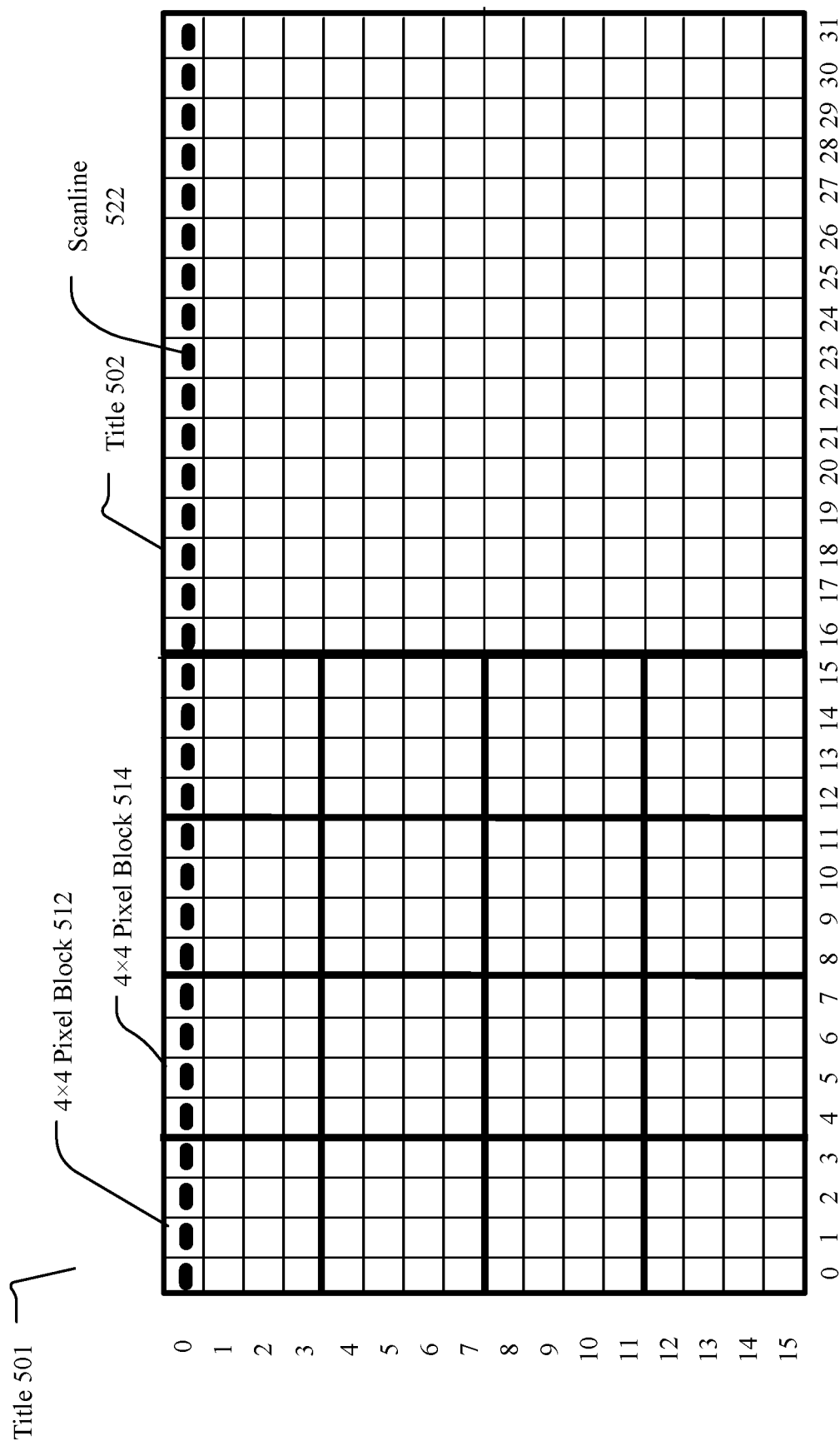
FIG. 5A illustrates an example process for writing pixels in tile-order and reading pixels in row-order.

FIG. 5A illustrates an example process for writing pixels in tile-order and reading pixels in pixel-row-order. In particular embodiments, the display block may write pixels into the pixel buffer in tile-order and read pixels from the pixel buffer in row-order or scanline order (e.g., with one row of pixels per scanline). As example and not by way of limitation, the display block may receive pixels from the corresponding pixel block and organize the received pixels into aligned 4×4 blocks based on the pixel positions within the associated tile. The aligned 4×4 blocks (e.g., pixel blocks 512 and 514) may be written into the pixel buffer based on their positions within the associated tile (e.g., tile 501). The writing operations may be repeated until all the pixels of the current tile (e.g., tile 501) are written into the pixel buffer. Then, the display bock may start the writing process for next tile (e.g., tile 502 following the tile-order of left-to-right) until all the tiles of the first tile-row are finished. After the two tile-rows being swapped, the display block may start the writing processes for the second tile-row while the pixels in the first tile-row being read out. In particular embodiments, each writing operation may involve an aligned 4×2 pixel array (e.g., half of a 4×4 pixel block) which may be aligned based on the relative pixel positions within the associated tile.

In particular embodiments, the display block may read out pixels from the pixel buffer in pixel-row-order (as used herein, "pixel-row" refers to a single row of pixels) or scanline order. For example, the display block may read pixels from the pixel buffer pixel-row by pixel-row (e.g., following a scanline 522 from left to the right). In particular embodiments, each reading operation may involve an aligned 8×1 pixels corresponding to the half width of a tile. For example, the display block may read, from a pixel-row (e.g., row 0), a first aligned 8×1 pixels (e.g., pixel 0~pixel 7 of row 0) and then move to next aligned 8×1 pixels (e.g., pixel 8 pixel 15 of row 0) of the same pixel-row. The display block may repeat this process until all pixels of valid tiles in this pixel-row are read out. Then, the display block may move to next pixel-row (e.g., row 1) and repeat this process until all 16 rows of pixels in one tile-row of the pixel buffer are read out. After the tile-rows being swapped, the display block may repeat this reading process on the other tile-row.

Figure 5B:
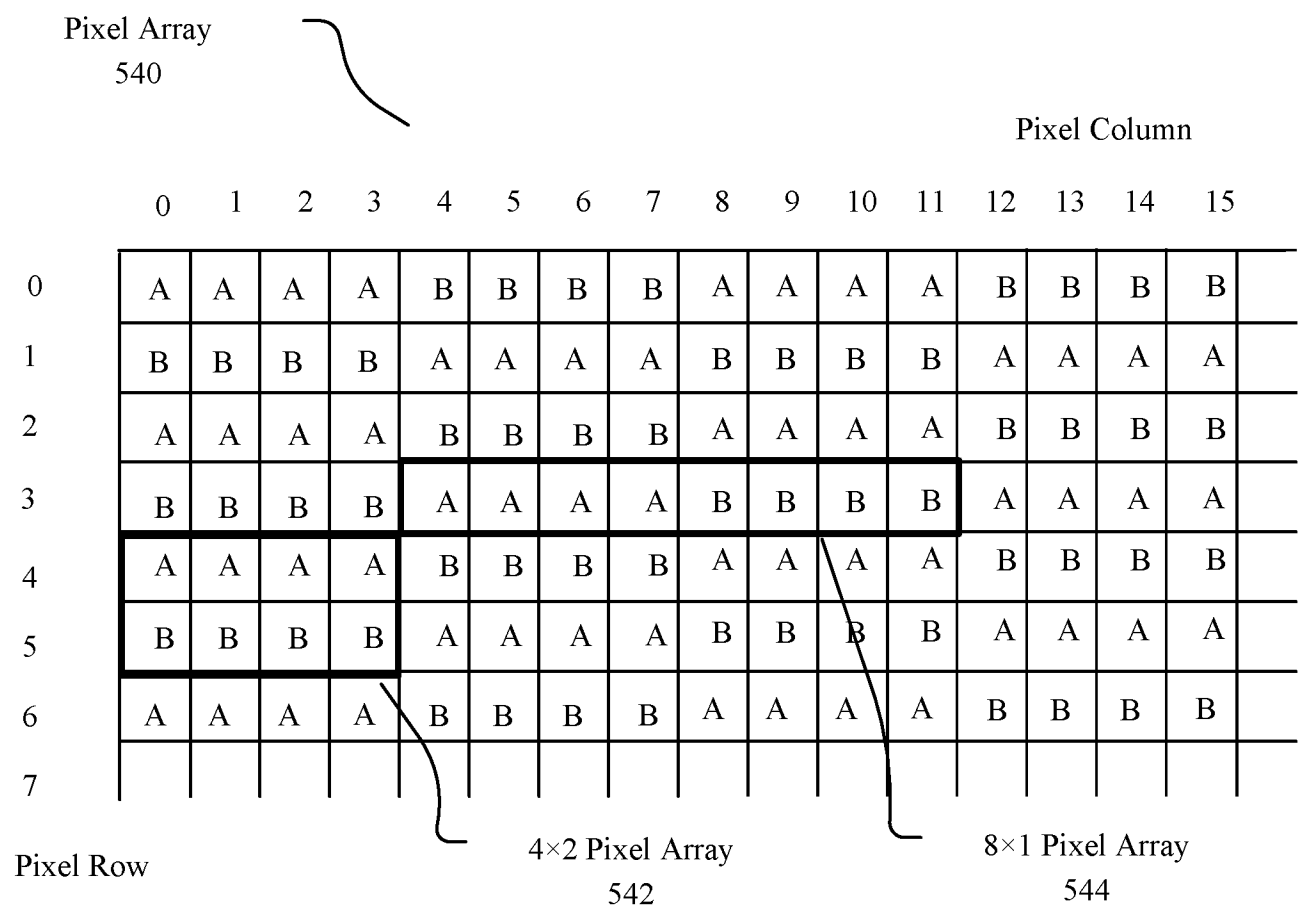

FIG. 5B illustrates an example pattern for storing pixels in two data banks of the pixel buffer to support the tile-order writing and pixel-row-order reading operations. In particular embodiments, the pixel buffer may be configured to allow data to be written in tile-order and to be read out in pixel-row-order or scanline order. In particular embodiments, the pixel buffer may be organized using two data banks to support tile-order writing operations and pixel-row-order reading operations. For an even row of pixels, a first group of 4 pixels may be stored in the first data bank and the following 4 pixels may be stored in the second data bank. For an odd row of pixels, a first group of 4 pixels may be stored in the second data bank and the following 4 pixels may be stored in the first data bank. As a result, each aligned 4×2 writing operation and each aligned 8×1 reading operation may access 4×1 pixels from the first data bank and 4×1 pixels from second data bank. For example, the pixel array 540 may be stored in the two data banks A and B in a pattern as shown in FIG. 5B using the method as described above. When the input pixels are written into the pixel buffer, the input pixels may be organized into 4×4 blocks which are written into the pixel buffer based on the tile-order and their relative positions within an associated tile. Each writing operation may involve an aligned 4×2 pixel array. When the pixels are read out, the pixels may be read out by scanline with one row of pixels per scanline. Each reading operation may involve an aligned 8×1 pixel array. Because the pixel array 540 is stored in the data bank A and B in the pattern as shown in FIG. 5B, each aligned 4×2 pixel array (e.g., pixel array 542) and each 8×1 aligned pixel array (e.g., pixel array 544) may always cover 4×1 pixels from the data bank A and 4×1 pixels from the bank B. This allows the pixel data which is written into the pixel buffer in tile-order to support the pixel-row-order reading operations while keep both writing operations and reading operations evenly distributed between the two data banks.

In particular embodiments, the pixels received by the display block may be organized into a number of tiles each of which includes a 16×16 pixels array. The pixel buffer may store a 2×160 tile array corresponding to 32×2560 36-bit pixels. In particular embodiments, the display block may generate a 1-bit tile-validity bit for each tile stored in the pixel buffer. The tile-validity bit for a tile may be generated based on the displaying content associated with that tile. For example, if a tile includes at least a portion of an object or any displaying content to be displayed (e.g., a game character, a tag, an icon, a building, a person, a poster, etc.), the tile may include pixels that are needed for displaying that object or display content, and the tile may be marked as a valid tile with the corresponding tile-validity bit being set to 1. As another example, if a tile is associated with background areas (e.g., black background areas) of the scene, the tile may not include any pixels that are needed to display any object or display content, and consequently the tile may be marked as an invalid tile with the corresponding tile-validity bit being set to 0. As described above, the tile-validity meta-data buffer used for storing the tile-validity bits may be cleared during read out (e.g., all default to 0), and the tile-validity bit may be changed to 1 whenever associated pixel data is written to the pixel buffer.

Figure 6A:
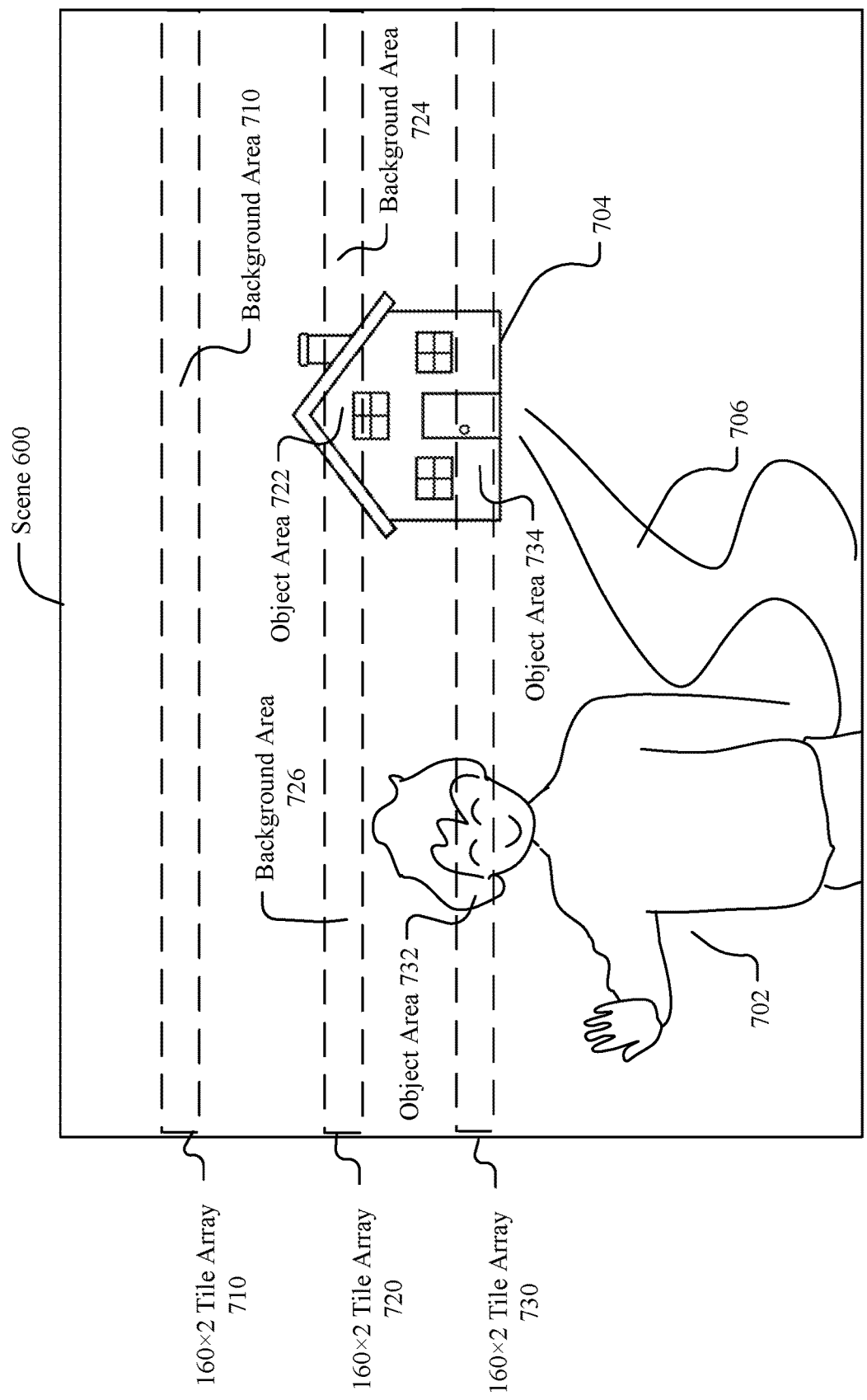
FIG. 6A illustrates an example scene including object areas and background areas.

FIG. 6A illustrate an example scene 600 including object areas and background areas. In particular embodiments, the scene to be displayed may include a large percentage of background areas which may be kept black (i.e., unlit) on the display (e.g., a real-world scene on which augmented-reality content is superimposed). As an example and not by way of limitation, the scene 600 may include a rendered person 702, a rendered house 704, and a rendered road 706, and the rest of the areas of the scene 600 may be background areas where the pixels are unlit on the display. The first 160×2 tile array 710 may all fall within the background area, and therefore all the tiles in array 710 may be marked as invalid tiles with corresponding tile-validity bits being set to 0. The second 160×2 tile array 720 may cover a portion of the house 722, and therefore the tiles that include the pixels related to the house 704 may be marked as valid tiles with corresponding tile-validity bit being set to 1. The rest tiles (e.g., tiles in the background areas 724 and 726) in array 720 that do not include any pixels related to the house 704 may be marked as invalid tiles with corresponding tile-validity bits being set to 0. The third 160×2 tile array 730 may cover a portion of the house 704 and a portion of the person 702. The tiles associated with these two object areas 732 and 734 may be marked as valid tiles and all other tiles in the array 730 may be marked as invalid tiles. In particular embodiments, the 1-bit tile-validity bit may be stored in the tile-validity meta-data buffer. The tile-validity bits may be set when the corresponding tiles are written into the pixel buffer and may be cleared when the pixels of these tiles are read out. As can be seen from this example, in certain augmented-reality applications, a significant number of tiles in a scene may be invalid.

Figure 6B:
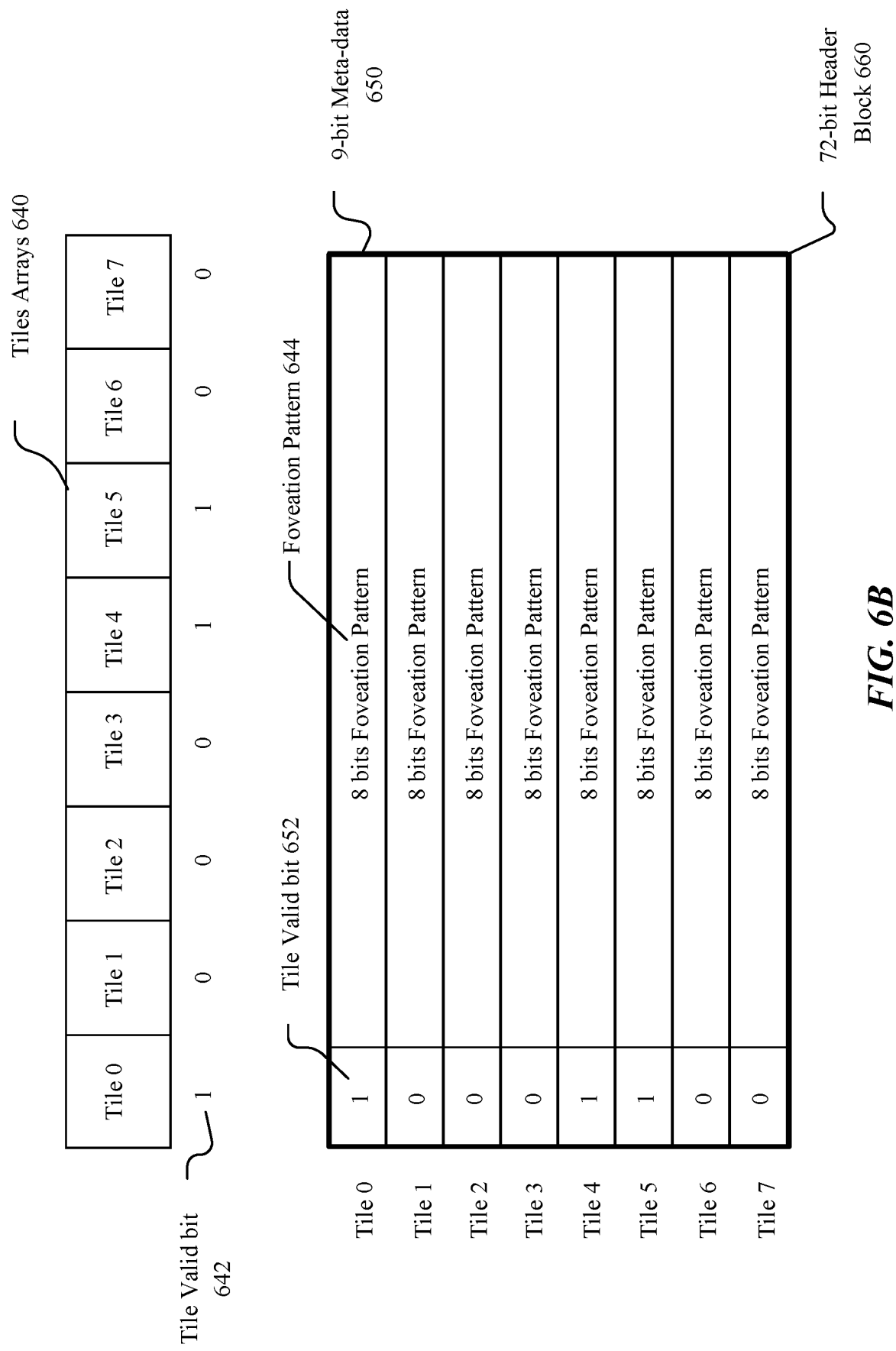
FIG. 6B illustrates an example tile array and corresponding tile-validity bits.

FIG. 6B illustrates an example tile array 640 and corresponding tile-validity bits. As an example and not by way of limitation, the eight tiles (tile 1~tile 7) in the array 640 may have their respective tile-validity bits (e.g., 1-bit tile-validity bit 642) be determined (e.g., using the processes described in FIG. 6A and elsewhere herein) as 1, 0, 0, 0, 1, 1, 0, and 0, which indicate that the tiles 0, 4, and 5 are valid tiles and tiles 1, 2, 3, 6, and 7 are invalid tiles. In particular embodiments, the tile-validity bit associated with a tile may be stored in combination with an 8-bit foveation pattern (e.g., foveation pattern 644) which is associated with the same tile. The combination may form a 9-bit meta-data word (e.g., 9-bit meta-data 650). The 9-bit meta-data may have the tile-validity bit as the high order 1 bit and the 8-bit foveation pattern as the low order 8 bits. In particular embodiments, a group of eight 9-bit meta-data associated with eight tiles may be combined into a 72-bit header block 660, as illustrated in FIG. 6B, to be sent out to physical displays. The particular size of the header block 660 may be selected based on the output bandwidth of the data bus (e.g., data bus 309 shown in FIG. 3), so that the header block 660 may be written in one clock cycle. If the bandwidth of the data bus is different, a different configuration of the header block 660 may be defined to achieve the same goal (e.g., if the bandwidth of the data bus 309 is 36 bits, then the header block 660 may include a group of four 9-bit meta data instead). In particular embodiments, the header block 660 may be assembled by the pixel sequencer 322, as shown in FIG. 3, and sent out via the pixel output block 325 to the downstream device before the corresponding pixel data is sent out.

Figure 7:
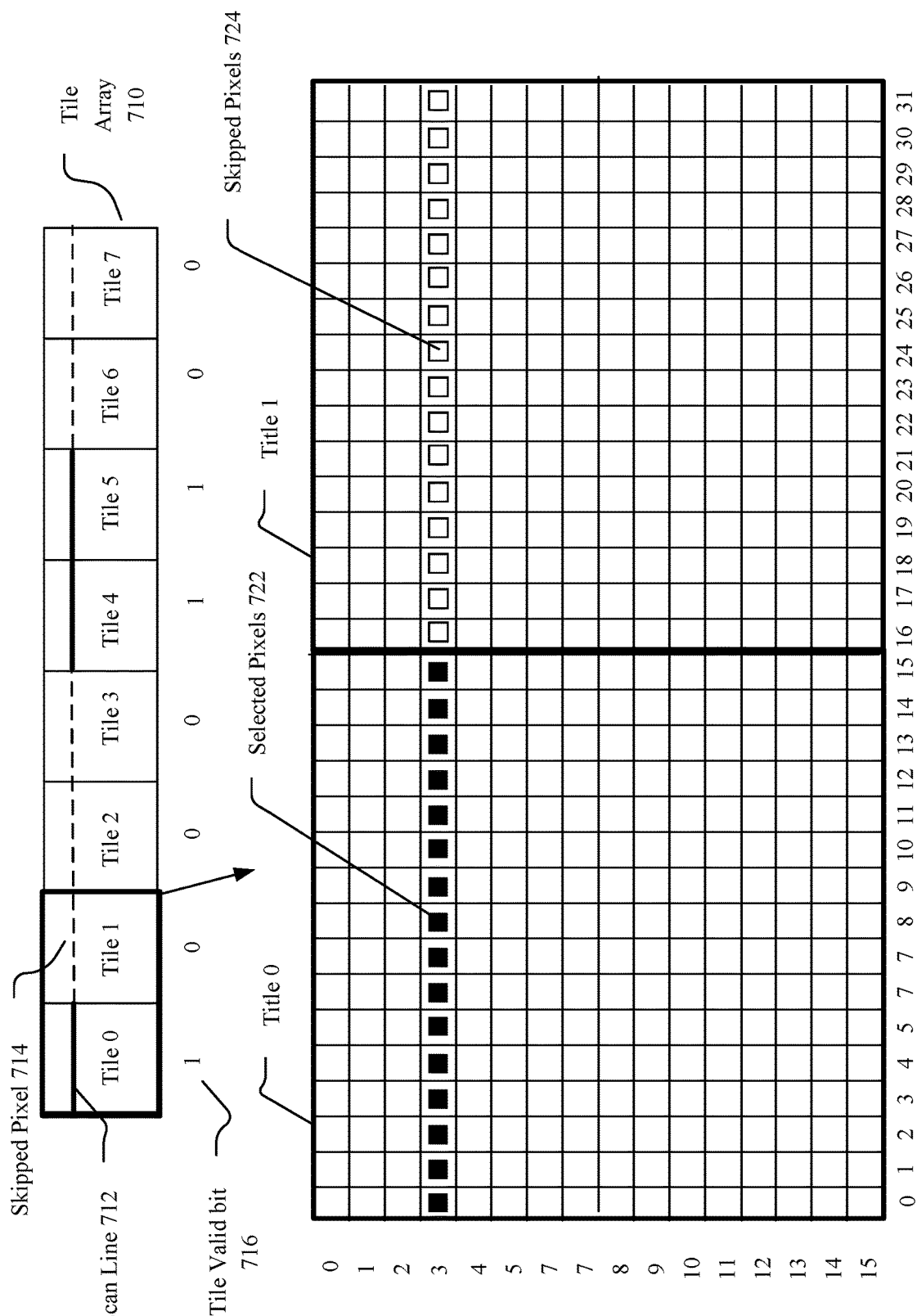
FIG. 7 illustrates an example process for reading a row of pixels from valid tiles and skipping pixels of invalid tiles.

FIG. 7 illustrates an example process for reading a row of pixels from valid tiles and skipping pixels of invalid tiles. In particular embodiments, the display block may interleave reading operations with the writing operations to drive a display with 24-bit or 30-bit pixels. In particular embodiments, before reading pixel data, the pixel sequencer of the display block may read all tile-validity bits and foveation pattern values corresponding to a predetermined number of tiles (e.g., 8 tiles). In particular embodiments, the tile-validity meta-data buffer and the foveation pattern memory may need to be accessed at a rate of one value per clock. Each tile-validity bit and an 8-bit foveation pattern values may be assembled into 9-bit per-tile meta-data by the pixel sequencer of the display block. Then, a sequential sets of eight of these 9-bit per-tile units may be assembled by the pixel sequencer of the display block into a 72-bit header block to be sent out to the corresponding pixel output block. After each valid bit is accessed in a pixel buffer, the corresponding tile-validity meta-data buffer 314 may need to be cleared to zero when the buffer is swapped. The display block may swap the tile-rows in the pixel buffer when the data outputting process has finished from the current tile-row.

After the header block is assembled, the pixel sequencer of the display block may read the pixels from each valid tile of the current tile-row. As an example and not by way of limitation, the tile array 701 may include 8 tiles with corresponding tile-validity bits (e.g., tile-validity bit 716) to be 1, 0, 0, 0, 1, 1, 0, 0, which indicate that the tiles 0, 4, and 5 are valid tiles and the tiles 1, 2, 3, and 6 are invalid tiles. The pixel sequencer of the display block may scan a row of pixels (e.g., using the scanline 712) across all tiles in the current tile-row and read the pixels of each valid tile in the current tile-row. For example, the pixel sequencer of the display block may read all pixels of a pixel-row (e.g., pixel 0~pixel 15 of any pixel-row) from the tile 0 since it is marked by the tile-validity bit as valid tile. The pixel sequencer of the display block may skip all the pixels (e.g., pixels 16~pixel 31 of any pixel-row) from the tile 1 since it is marked by the tile-validity bit as invalid tile. As shown in FIG. 7, the pixels 722 of valid tile (e.g., tile 0) to be read out are marked by solid squares and the skipped pixels 724 of invalid tile (e.g., tile 1) are marked by hollow squares. In particular embodiments, the display block may read an aligned 8×1 pixel block per reading operation and repeat the reading process until all the valid tile pixels in the current scanline have been read out. Then, the display block may move to the next row of pixels and repeat the process until all valid tile pixels from all 16 pixel-rows in the current tile-row have been read out. During these reading processes, the header block, which includes the tile-validity meta-data, and pixels of the valid tiles that have been read out, may be output to physical displays. The display block may swap the tile-rows in the pixel buffer when the data outputting process has finished from the current tile-row, and then repeat the writing, reading, and outputting processes until all pixels of a scene have been output to the display.

In particular embodiments, the display block may organize the display data (e.g., pixels from valid tiles and tile-validity meta-data) based on a group of 8 tiles in the currently reading tile-row. In particular embodiments, the display block may output the header block before outputting the corresponding row of pixel data. The header block may be a 72-bit unit including eight 9-bit meta data for the 8 tiles. The 72-bit header block may be sent out on two 36-bit output paths (e.g., the MIPI0 and MIPI1 ports of the external logic unit), organized in the order of the corresponding tiles (e.g., from left to right sequentially) in the current tile-row. Next, corresponding pixel data of valid tiles from the pixel buffer may be sent out. The display block may send out two 36-bit pixels a time and repeat the outputting process until all the pixels current pixel-row are finished. Then, the display block may move the next pixel-row and repeat the output process until all pixels in the current tile-row are finished. Then, the display block may swap the pixel buffers and repeat these processes for another row of tiles until the current scene is finished. The objects to be displayed may be rendered on display based on the pixels of the valid tiles and the tile-validity meta-data included in the header blocks.

In particular embodiments, the display block may output either a null value (e.g., for refresh intervals), two 36-bit pixels, or a runlength code of a runlength encoded sequence based on the tile-validity meta-data that specifies a number of invalid pixels. The runlength code of the runlength encoded sequences may indicate the black pixels corresponding to display areas that are left unlit. Using the tile-validity meta-data, the downstream device may display each received pixel at the correct position on the display screen based on which tiles are valid/invalid. For example, if the first tile is invalid and the second is valid, the first set of 16 pixels on the display screen should be left unlit, and the first set of 16 pixels that are received by the downstream device may be associated with the second tile of the current tile-row, and therefore should be display at the screen position corresponding to the second tile instead of the first tile.

In particular embodiments, a large fraction of the display may be black, and therefore unlit. The runlength encoding based on the tile-validity meta-data reduces the power required to drive the display and allows an external FPGA to drive external displays with faster pixel rates than the pixel rate that the headset system natively supports. By skipping the invalid tiles, the headset system may accommodate uncompressed 36-bit pixel data on the width-limited data bus to support high resolutions and high pixel rates. The display block may include two output ports and each port may send out 16 bits sequentially for the pixels from valid tiles along the swath of tiles. Full 36-bit pixels may be sent to allow the physical display or external FPGA to work with the full precision color components (e.g., 12-bit for each color component) as computed by the headset system.

Figure 8:
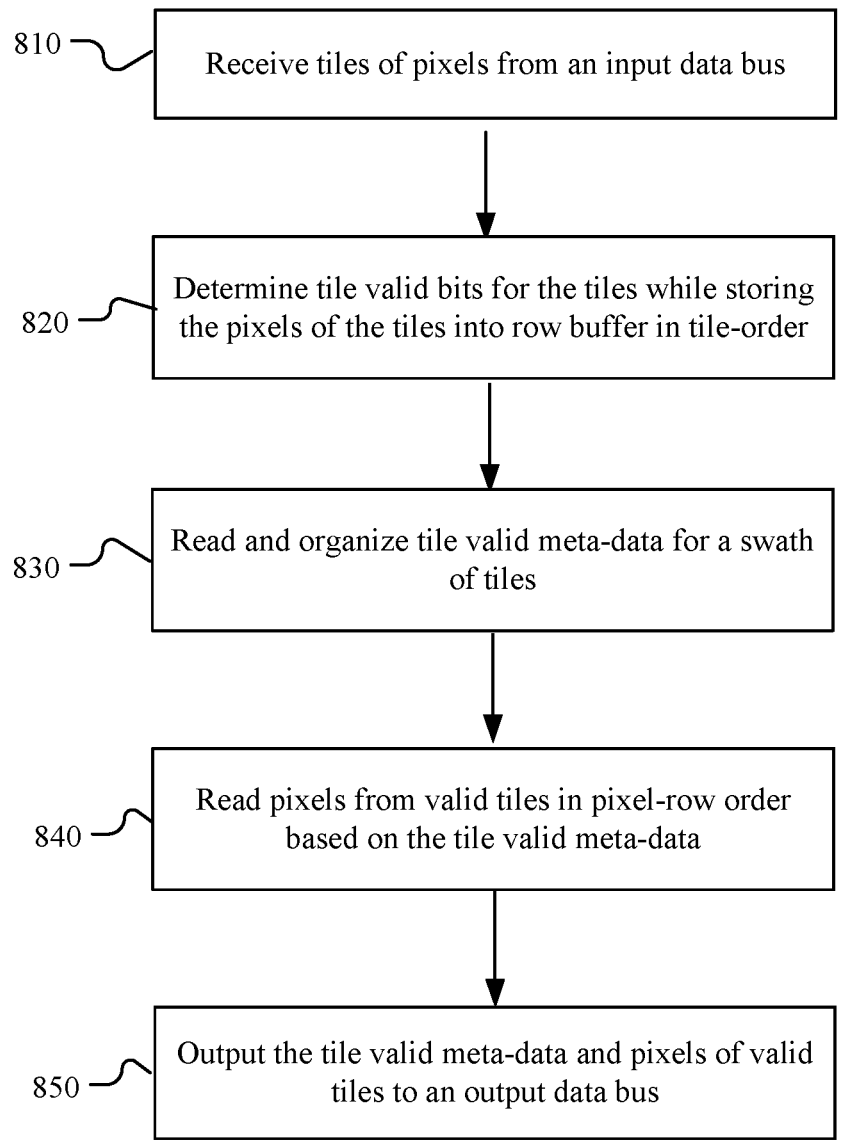
FIG. 8 illustrates an example method for selectively outputting pixels to display based on the associated displaying content.

FIG. 8 illustrates an example method 800 for selectively outputting pixels to display based on the associated displaying content. The method 800 may begin at step 810, where the display block may receive tiles of pixels from the corresponding pixel blocks via an input data bus. In particular embodiments, the display block may receive pixels in 2×2 quads and may organize the received pixels into aligned 4×4 blocks based on their position within a tile and the order of all related tiles. The received pixels may be written into one of the two tile-rows in the pixel buffer following the order of the corresponding tiles. At step 820, the display block may determine a tile-validity bit for each tile stored in pixel buffer. The tile-validity bit for each tile may be determined based on displaying content associated with the pixels in that tile, or in other words, whether that tile is associated with at least a portion of a display object or any displaying content with available pixel data. For example, if a tile includes pixels that are associated with an object to be displayed, and therefore such pixel data is being written to the pixel buffer, then the tile may be marked as a valid tile with the corresponding tile-validity bit being set to 1. As another example, if a tile does not include any pixels that are associated with an object to be displayed, that tile may be marked as an invalid tile with corresponding tile-validity bit being set to 0 (e.g., this may be the default value of the tile-validity bits). The valid tiles may correspond to the objects or displaying content to be displayed. The invalid tiles may correspond to the background areas of the scene which may be left black or unlit. The tile-validity bits may be determined by the display block when the pixels of the corresponding tiles are written into a tile-row in the pixel buffer. The tile-validity bits may be stored in a tile-validity meta-data buffer and may be cleared when the pixels of the corresponding tiles are read out. In particular embodiments, the display block may receive foveation pattern data from another input data bus and store the foveation pattern data in a foveation pattern memory.

At step 830, the display block may read and organize the tile-validity meta-data for a group of tiles. The group of tiles may include 8 tiles from one tile-row in the pixel buffer. The tile-validity bits of the 8 tiles may be read out from the tile-validity meta-data buffer and may be combined with corresponding 8-bit foveation pattern to form 9-bit meta-data units. The eight 9-bit meta-data units may be further combined into a 72-bit header block corresponding to the group of tiles. The header block may be output at the start of outputting a group of pixels in the group of tiles. At step 840, the display block may read pixels from the pixel buffer for outputting. The pixel buffer may store the pixels in tile-order in which the pixels are formerly written into the pixel buffer. The display block may read pixels from the pixel buffer in pixel-row-order using scanlines (e.g., one row of pixels per scanline). The display block may only read the pixels from valid tiles as indicated by the corresponding tile-validity bits and may skip the pixels of the invalid tiles, which correspond to the unlit background areas in the scene. The pixel buffer may support writing operations on one of the tile-row while allow pixel data in the other tile-row to be read out for outputting at the same time. The display block may parallelly perform the writing and reading operation on the two tile-row stored in the pixel buffer.

At step 850, the display block may output the pixels of the valid tiles and the corresponding tile-validity meta-data included in a header block to an output data bus. In particular embodiments, the display block may output either a null value (e.g., for refresh intervals), two 36-bit pixels, or a runlength encoded code of a runlength encoded sequence based on the tile-validity meta-data that specifies a number of invalid pixels. The runlength code of the runlength encoded sequences may indicate the black pixels corresponding to display areas that are left unlit, and therefore allow the pixels of the valid tiles to be rendered on the display at correct positions. In particular embodiments, the output data bus may have limited width (e.g., 2×36 bit) and may be incapable to transmit all pixels (in uncompressed formats) of all valid and invalid tiles to support high resolutions and high update rates (e.g., 2560×1440 220 Hz, 2560×1600 120 Hz). By skipping the pixels of the invalid tiles, the headset system may reduce bandwidth requirement for transmitting display data to display at high update rates. In the meantime, because no data compression is used, the headset system eliminates information loss caused by data compression by sending uncompressed display data rather than compressed data for display, and therefore enable better display quality. The display areas corresponding to the pixels of the invalid tiles may be kept black or unlit, which reduces the power consumption for driving the display. In particular embodiments, a large fraction of the scene may be black background areas and headset system may allow the displaying content to be updated to external displays at a higher pixel rate than the native pixel rate of the headset system.

In particular embodiments, a computing system may write a first set of pixel values into a first buffer in a tile-order. The first set of pixel values may be organized into a first set of tiles. The system may generate first validity data for the first set of tiles stored in the first buffer. The first validity data may include a validity indicator for each tile of the first set of tiles to indicate if that tile is a valid tile. The system may read from the first buffer a first subset of pixel values in a pixel row order corresponding to pixel rows of the first set of tiles based on the valid data of the first set of tiles. The first subset of pixel values may be associated with one or more valid tiles of the first set of tiles as indicated by respective validity indicators. The system may send the first subset of pixel values and the first validity data of the first set of tiles to a display via an output data bus.

In particular embodiments, the system may write a second set of pixel values into a second buffer while reading from the first subset of pixel values from the first buffer. The second set of pixel values may be organized into a second set of tiles and written in the second buffer in the tile-order. The system may generate a second validity data for the second set of tiles stored in the second buffer. The second validity data may include a validity indicator for each tile of the second set of tiles to indicate if that tile is a valid tile. The system may read a second subset of pixel values from the second buffer while writing a third set of pixel values into the first buffer. The second subset of pixel values may be associated with one or more valid tiles of the second set of tiles as indicated by respective validity indicators. The system may send the second subset of pixel values and the second validity data of the second set of tiles to the display via the output data bus.

In particular embodiments, the first buffer may correspond to a first tile-row of a pixel buffer. The second buffer may correspond a second tile-row of the pixel buffer. The first tile-row and the second tile-row may be parallelly accessed for reading and writing operations, respectively. In particular embodiments, the first set of pixel values may be written into the first buffer by writing a 4×2 array of pixels into the first buffer using one writing operation. The first subset of pixel values may be read from the first buffer by reading an 8×1 array of pixels using one reading operation. In particular embodiments, the first set of pixel values may be stored in two data banks using a storage pattern allows pixels of each aligned 4×2 array of pixels or each aligned 8×1 array of pixels to be evenly spread into the two data banks. The writing operation writing a 4×2 array of pixels into the first buffer and the reading operation reading an 8×1 array of pixels from the first buffer may have even accesses to the two data banks.

In particular embodiments, the validity indicator for each tile may include a validity bit which may be determined based on a content of a scene associated with that tile. The validity bit may equal to 1 indicating that tile being a valid tile when the content of scene associated with that tile is an object to be displayed. The validity bit may equal to 0 indicating that tile being a valid tile when the content of scene associated with that tile is associated with a background area. In particular embodiments, the first validity data may further include foveation pattern data. The system may combine a number of validity bits and corresponding foveation pattern data into a header block and send the header block comprising the first validity data to the display via the output data bus and during one clock cycle. The first subset of pixel values sent to the display via the output data bus may be in an uncompressed format. The display may generate a display content for one or more areas corresponding to the one or more valid tiles. The display content may be generated based at least on the first subset of pixels and the first validity data of the first set of tiles. One or more areas of the display corresponding to one or more invalid tiles may be unaugmented or unlit.

In particular embodiments, the system may skip one or more pixel subsets associated with one or more invalid tiles as indicated by respective validity indicators. The system may store the first validity data for the first set of tiles into a tile valid meta-data buffer. The system may read the first validity data from the tile valid meta-data buffer before reading the first subset of pixels values from the first buffer. The system may clear the first validity data in the tile valid meta-data buffer after the first subset of pixels has been read out from the first buffer. The first set of pixel values may be received by the computing system in quads each including 2×2 pixels. The first set of pixels may be organized into aligned 4×4 blocks based on relative positions within a corresponding tile. In particular embodiments, the first subset of pixel values may be displayed on the display at a pixel rate higher than a native pixel rate of the display. The first subset of pixel values may have less pixel values than the first set of pixel values.

Particular embodiments may repeat one or more steps of the method of FIG. 8, where appropriate. Although this disclosure describes and illustrates particular steps of the method of FIG. 8 as occurring in a particular order, this disclosure contemplates any suitable steps of the method of FIG. 8 occurring in any suitable order. Moreover, although this disclosure describes and illustrates an example method for selectively outputting pixels to display based on the associated displaying content including the particular steps of the method of FIG. 8, this disclosure contemplates any suitable method for selectively outputting pixels to display based on the associated displaying content including any suitable steps, which may include all, some, or none of the steps of the method of FIG. 8, where appropriate. Furthermore, although this disclosure describes and illustrates particular components, devices, or systems carrying out particular steps of the method of FIG. 8, this disclosure contemplates any suitable combination of any suitable components, devices, or systems carrying out any suitable steps of the method of FIG. 8.

Figure 9:
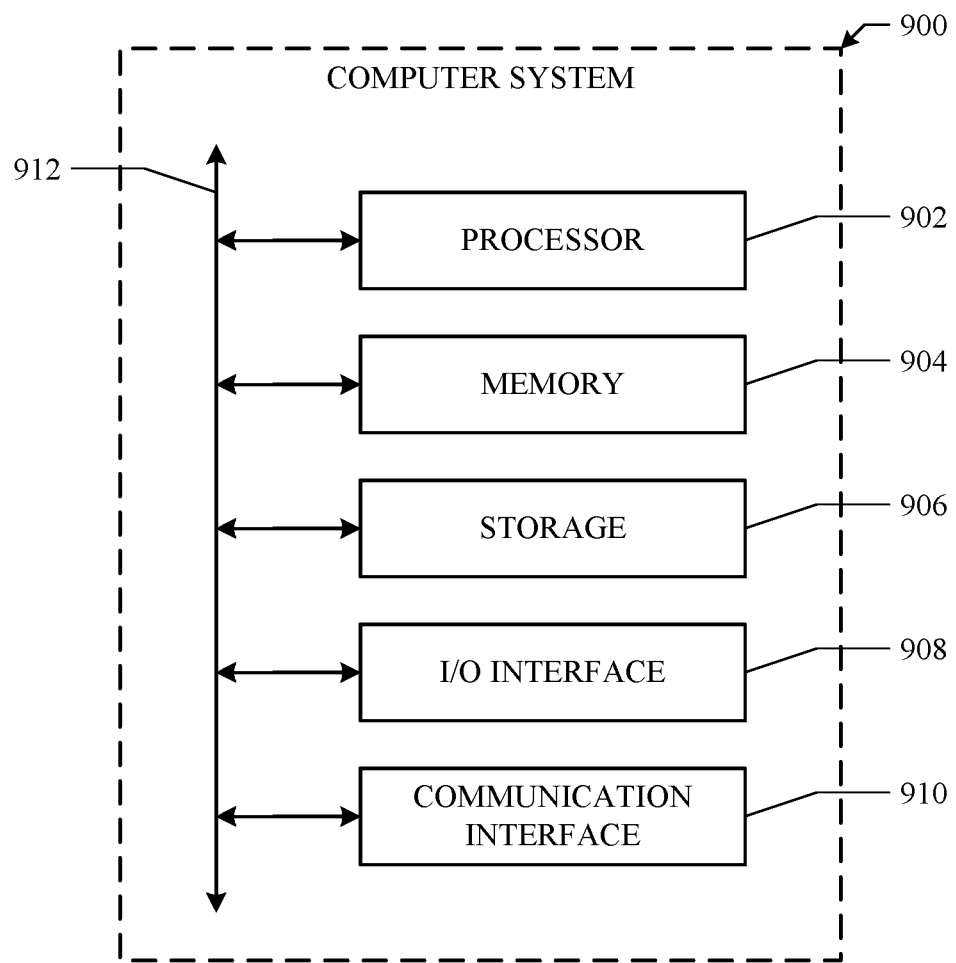
FIG. 9 illustrates an example computer system.

FIG. 9 illustrates an example computer system 900. In particular embodiments, one or more computer systems 900 perform one or more steps of one or more methods described or illustrated herein. In particular embodiments, one or more computer systems 900 provide functionality described or illustrated herein. In particular embodiments, software running on one or more computer systems 900 performs one or more steps of one or more methods described or illustrated herein or provides functionality described or illustrated herein. Particular embodiments include one or more portions of one or more computer systems 900. Herein, reference to a computer system may encompass a computing device, and vice versa, where appropriate. Moreover, reference to a computer system may encompass one or more computer systems, where appropriate.

This disclosure contemplates any suitable number of computer systems 900. This disclosure contemplates computer system 900 taking any suitable physical form. As example and not by way of limitation, computer system 900 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 900 may include one or more computer systems 900; be unitary or distributed; span multiple locations; span multiple machines; span multiple data centers; or reside in a cloud, which may include one or more cloud components in one or more networks. Where appropriate, one or more computer systems 900 may perform without substantial spatial or temporal limitation one or more steps of one or more methods described or illustrated herein. As an example and not by way of limitation, one or more computer systems 900 may perform in real time or in batch mode one or more steps of one or more methods described or illustrated herein. One or more computer systems 900 may perform at different times or at different locations one or more steps of one or more methods described or illustrated herein, where appropriate.

In particular embodiments, computer system 900 includes a processor 902, memory 904, storage 906, an input/output (I/O) interface 908, a communication interface 1410, and a bus 1412. Although this disclosure describes and illustrates a particular computer system having a particular number of particular components in a particular arrangement, this disclosure contemplates any suitable computer system having any suitable number of any suitable components in any suitable arrangement.

In particular embodiments, processor 902 includes hardware for executing instructions, such as those making up a computer program. As an example and not by way of limitation, to execute instructions, processor 902 may retrieve (or fetch) the instructions from an internal register, an internal cache, memory 904, or storage 906; decode and execute them; and then write one or more results to an internal register, an internal cache, memory 904, or storage 906. In particular embodiments, processor 902 may include one or more internal caches for data, instructions, or addresses. This disclosure contemplates processor 902 including any suitable number of any suitable internal caches, where appropriate. As an example and not by way of limitation, processor 902 may include one or more instruction caches, one or more data caches, and one or more translation lookaside buffers (TLBs). Instructions in the instruction caches may be copies of instructions in memory 904 or storage 906, and the instruction caches may speed up retrieval of those instructions by processor 902. Data in the data caches may be copies of data in memory 904 or storage 906 for instructions executing at processor 902 to operate on; the results of previous instructions executed at processor 902 for access by subsequent instructions executing at processor 902 or for writing to memory 904 or storage 906; or other suitable data. The data caches may speed up read or write operations by processor 902. The TLBs may speed up virtual-address translation for processor 902. In particular embodiments, processor 902 may include one or more internal registers for data, instructions, or addresses. This disclosure contemplates processor 902 including any suitable number of any suitable internal registers, where appropriate. Where appropriate, processor 902 may include one or more arithmetic logic units (ALUs); be a multi-core processor; or include one or more processors 902. Although this disclosure describes and illustrates a particular processor, this disclosure contemplates any suitable processor.

In particular embodiments, memory 904 includes main memory for storing instructions for processor 902 to execute or data for processor 902 to operate on. As an example and not by way of limitation, computer system 900 may load instructions from storage 906 or another source (such as, for example, another computer system 900) to memory 904. Processor 902 may then load the instructions from memory 904 to an internal register or internal cache. To execute the instructions, processor 902 may retrieve the instructions from the internal register or internal cache and decode them. During or after execution of the instructions, processor 902 may write one or more results (which may be intermediate or final results) to the internal register or internal cache. Processor 902 may then write one or more of those results to memory 904. In particular embodiments, processor 902 executes only instructions in one or more internal registers or internal caches or in memory 904 (as opposed to storage 906 or elsewhere) and operates only on data in one or more internal registers or internal caches or in memory 904 (as opposed to storage 906 or elsewhere). One or more memory buses (which may each include an address bus and a data bus) may couple processor 902 to memory 904. Bus 1412 may include one or more memory buses, as described below. In particular embodiments, one or more memory management units (MMUs) reside between processor 902 and memory 904 and facilitate accesses to memory 904 requested by processor 902. In particular embodiments, memory 904 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 904 may include one or more memories 904, where appropriate. Although this disclosure describes and illustrates particular memory, this disclosure contemplates any suitable memory.

In particular embodiments, storage 906 includes mass storage for data or instructions. As an example and not by way of limitation, storage 906 may include a hard disk drive (HDD), a floppy disk drive, flash memory, an optical disc, a magneto-optical disc, magnetic tape, or a Universal Serial Bus (USB) drive or a combination of two or more of these. Storage 906 may include removable or non-removable (or fixed) media, where appropriate. Storage 906 may be internal or external to computer system 900, where appropriate. In particular embodiments, storage 906 is non-volatile, solid-state memory. In particular embodiments, storage 906 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 906 taking any suitable physical form. Storage 906 may include one or more storage control units facilitating communication between processor 902 and storage 906, where appropriate. Where appropriate, storage 906 may include one or more storages 906. Although this disclosure describes and illustrates particular storage, this disclosure contemplates any suitable storage.

In particular embodiments, I/O interface 908 includes hardware, software, or both, providing one or more interfaces for communication between computer system 900 and one or more I/O devices. Computer system 900 may include one or more of these I/O devices, where appropriate. One or more of these I/O devices may enable communication between a person and computer system 900. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 908 for them. Where appropriate, I/O interface 908 may include one or more device or software drivers enabling processor 902 to drive one or more of these I/O devices. I/O interface 908 may include one or more I/O interfaces 908, where appropriate. Although this disclosure describes and illustrates a particular I/O interface, this disclosure contemplates any suitable I/O interface.

In particular embodiments, communication interface 1410 includes hardware, software, or both providing one or more interfaces for communication (such as, for example, packet-based communication) between computer system 900 and one or more other computer systems 900 or one or more networks. As an example and not by way of limitation, communication interface 1410 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1410 for it. As an example and not by way of limitation, computer system 900 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 900 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 900 may include any suitable communication interface 1410 for any of these networks, where appropriate. Communication interface 1410 may include one or more communication interfaces 1410, where appropriate. Although this disclosure describes and illustrates a particular communication interface, this disclosure contemplates any suitable communication interface.

In particular embodiments, bus 1412 includes hardware, software, or both coupling components of computer system 900 to each other. As an example and not by way of limitation, bus 1412 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1412 may include one or more buses 1412, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising, by a computing system:
   writing a first set of pixel values into a first buffer in a tile-order, wherein the first set of pixel values are organized into a first set of tiles;
   generating first validity data for the first set of tiles stored in the first buffer, wherein the first validity data comprises a validity indicator for each tile of the first set of tiles to indicate if that tile is a valid tile;
   reading from the first buffer a first subset of pixel values in a pixel row order corresponding to pixel rows of the first set of tiles based on the first validity data of the first set of tiles, wherein the first subset of pixel values are associated with one or more valid tiles of the first set of tiles as indicated by respective validity indicators; and
   sending the first subset of pixel values and the first validity data of the first set of tiles to a display via an output data bus.

2. The method of claim 1, further comprising:
   writing a second set of pixel values into a second buffer while reading the first subset of pixel values from the first buffer, wherein the second set of pixel values are organized into a second set of tiles and written into the second buffer in the tile-order;
   generating a second validity data for the second set of tiles stored in the second buffer, wherein the second validity data comprises a validity indicator for each tile of the second set of tiles to indicate if that tile is a valid tile;
   reading a second subset of pixel values from the second buffer while writing a third set of pixel values into the first buffer, wherein the second subset of pixel values are associated with one or more valid tiles of the second set of tiles as indicated by respective validity indicators; and
   sending the second subset of pixel values and the second validity data of the second set of tiles to the display via the output data bus.

3. The method of claim 2, wherein the first buffer corresponds to a first tile-row of a pixel buffer, wherein the second buffer corresponds a second tile-row of the pixel buffer, and wherein the first tile-row and the second tile-row are parallelly accessed for reading and writing operations, respectively.

4. The method of claim 2, wherein the first set of pixel values are written into the first buffer by writing a 4×2 array of pixel values into the first buffer using one writing operation, and wherein the first subset of pixel values is read from the first buffer by reading an 8×1 array of pixel values using one reading operation.

5. The method of claim 4, wherein the first set of pixel values are stored in two data banks using a storage pattern allows pixel values of each aligned 4×2 array of pixel values or each aligned 8×1 array of pixel values to be evenly spread into the two data banks.

6. The method of claim 5, wherein the writing operation writing a 4×2 array of pixel values into the first buffer and the reading operation reading an 8×1 array of pixel values from the first buffer have even accesses to the two data banks.

7. The method of claim 1, wherein the validity indicator for each tile comprises a validity bit, and wherein the validity bit of that tile is determined based on a content of a scene associated with that tile.

8. The method of claim 7, wherein the validity bit equal to 1 indicating that tile being a valid tile, and wherein the valid tile is associated with an object to be displayed in the scene.

9. The method of claim 7, wherein the validity bit equal to 0 indicating that tile being an invalid tile, and wherein the invalid tile is associated a background area of the scene.

10. The method of claim 7, wherein the first validity data further comprises foveation pattern data, furthering comprising:
combining a plurality of validity bits and corresponding foveation pattern data into a header block; and
sending the header block comprising the first validity data to the display via the output data bus and during one clock cycle.

11. The method of claim 1, wherein the first subset of pixel values sent to the display via the output data bus is in an uncompressed format.

12. The method of claim 1, wherein the display generates a display content for one or more areas corresponding to the one or more valid tiles, and wherein the display content is generated based at least on the first subset of pixel values and the first validity data of the first set of tiles.

13. The method of claim 1, wherein one or more areas of the display corresponding to one or more invalid tiles are unaugmented or unlit.

14. The method of claim 1, further comprising:
skipping one or more pixel subsets associated with one or more invalid tiles of the plurality of tiles as indicated by respective validity indicators.

15. The method of claim 1, further comprising:
storing the first validity data for the first set of tiles into a tile valid meta-data buffer;
reading the first validity data from the tile valid meta-data buffer before reading the first subset of pixel values from the first buffer; and
clearing the first validity data in the tile valid meta-data buffer after the first subset of pixel values has been read out from the first buffer.

16. The method of claim 1, wherein the first set of pixel values is received by the computing system in quads each comprising 2×2 pixel values, and wherein the first set of pixel values is organized into aligned 4×4 blocks based on relative positions within a corresponding tile.

17. The method of claim 1, wherein the first subset of pixel values is displayed on the display at a pixel rate higher than a native pixel rate of the display.

18. The method of claim 1, wherein the first subset of pixel values has less pixel values than the first set of pixel values.

19. One or more computer-readable non-transitory storage media embodying software that is operable when executed to:
write a first set of pixel values into a first buffer in a tile-order, wherein the first set of pixel values are organized into a first set of tiles;
generate first validity data for the first set of tiles stored in the first buffer, wherein the first validity data comprises a validity indicator for each tile of the first set of tiles to indicate if that tile is a valid tile;
read from the first buffer a first subset of pixel values in a pixel row order corresponding to pixel rows of the first set of tiles based on the first validity data of the first set of tiles, wherein the first subset of pixel values are associated with one or more valid tiles of the first set of tiles as indicated by respective validity indicators; and
send the first subset of pixel values and the first validity data of the first set of tiles to a display via an output data bus.

20. A system comprising:
one or more processors; and
one or more computer-readable non-transitory storage media coupled to one or more of the processors and comprising instructions operable when executed by one or more of the processors to cause the system to:
write a first set of pixel values into a first buffer in a tile-order, wherein the first set of pixel values are organized into a first set of tiles;
generate first validity data for the first set of tiles stored in the first buffer, wherein the first validity data comprises a validity indicator for each tile of the first set of tiles to indicate if that tile is a valid tile;
read from the first buffer a first subset of pixel values in a pixel row order corresponding to pixel rows of the first set of tiles based on the first validity data of the first set of tiles, wherein the first subset of pixel values are associated with one or more valid tiles of the first set of tiles as indicated by respective validity indicators; and
send the first subset of pixel values and the first validity data of the first set of tiles to a display via an output data bus.

\* \* \* \* \*